US008501542B2

(12) United States Patent  (10) Patent No.: US 8,501,542 B2
Ishihara et al.  (45) Date of Patent: Aug. 6, 2013

(54) DOUBLE-FACED ELECTRODE PACKAGE, AND ITS MANUFACTURING METHOD

(75) Inventors: Masamichi Ishihara, Kitakyushu (JP); Harufumi Kobayashi, Tokyo (JP)

(73) Assignee: Oki Semiconductor Co., Ltd, Hachioji-Shi (JP)

( * ) Notice: Subject to any disclaimer, the term of this patent is extended or adjusted under 35 U.S.C. 154(b) by 0 days.

(21) Appl. No.: 13/412,128

(22) Filed: Mar. 5, 2012

(65) Prior Publication Data

US 2012/0164790 A1    Jun. 28, 2012

Related U.S. Application Data

(62) Division of application No. 12/093,708, filed as application No. PCT/JP2006/321956 on Nov. 2, 2006, now Pat. No. 8,154,110.

(30) Foreign Application Priority Data

Nov. 16, 2005   (JP) .................................. 2005-331156

(51) Int. Cl.
    *H01L 21/50*   (2006.01)
(52) U.S. Cl.
    USPC ................................... 438/113; 257/E21.599

(58) Field of Classification Search
    USPC ................. 438/106–108, 112–114, 123–128; 257/E21.599, E21.506
    See application file for complete search history.

(56) References Cited

U.S. PATENT DOCUMENTS 6,590,281 B2 * 7/2003 Wu et al. ........................ 257/684

FOREIGN PATENT DOCUMENTS

JP    2002-158312    * 5/2002

* cited by examiner

*Primary Examiner* — Hoa B Trinh
(74) *Attorney, Agent, or Firm* — McGlew and Tuttle, P.C.

(57) ABSTRACT

A dual-face package has an LSI chip sealed with a mold resin, and electrodes for external connections on both of the front face and the back face. The LSI chip is bonded onto the die pad of a leadframe whose outer lead portions are exposed as back-face electrodes at at least the back face. The LSI chip and a plurality of inner lead portions of the leadframe are connected by wiring. At least some of the plurality of inner lead portions have front-face electrodes integrally formed by working a portion of the leadframe. Head faces of the front-face electrodes, or bump electrodes connected to the respective head faces of the front-face electrodes serve as electrodes for external connections to another substrate, element, or the like.

8 Claims, 4 Drawing Sheets

(A)

HEAD FACE OF STUD BUMP

Y'

SIDE-FACE OUTER LEAD PORTION

Y

(B)

BACK-FACE OUTER LEAD PORTION

SIDE-FACE OUTER LEAD PORTION

(C)

WIRE BONDING — MOLD RESIN — STUD BUMP

LSI CHIP — DIE BOND MATERIAL — INNER LEAD PORTION

FRONT FACE

BACK FACE — DIE PAD — BACK-FACE OUTER LEAD PORTION

SIDE-FACE OUTER LEAD PORTION

(D)

DOUBLE-FACED ELECTRODE PACKAGE, AND ITS MANUFACTURING METHOD

CROSS REFERENCE TO RELATED APPLICATIONS

This application is a divisional under 37 CFR 1.53(b) of prior application Ser. No. 12/093,708 filed May 14, 2008 now U.S. Pat. No. 8,154,110 and claims the benefit (35 U.S.C. §120 and 365(C)) of International Application PCT/JP2006/321956 of Nov. 2, 2006, which designated inter alia the United States and which claims the priority of Japanese Patent Application JP 2005-331156 of Nov. 16, 2005. The entire contents of each application is hereby incorporated by reference in its entirety.

FIELD OF THE INVENTION

The invention relates to a dual-face package in which an LSI chip is sealed with a mold resin and which has electrodes for external connections on both of the front face and the back face, as well as to a method for manufacturing the same.

BACKGROUND OF THE INVENTION

In association with an increase in the degree of integration of LSI chips, there has been a strong demand for a reduction in package size. Under the circumstances, various package structures have been proposed. In recent years, developments have been carried out intensively for stacking semiconductor bare chips through utilization of through-silicon vias formed therein. Meanwhile, dual-face packages of real chip size are also highly likely to be commercialized. Conventional dual-face packages of any technology require a through-silicon via structure (refer to Patent Documents 1 and 2). Since existing insulation methods for through holes in a semiconductor substrate involve high-temperature treatment, application of such the insulation methods to a semiconductor packaging process is difficult. Formation of through holes in a semiconductor substrate and insulation for the through holes still involve problems to be solved; therefore, wiring without need of through-silicon vias is desired.

Patent Document 1: Japanese Patent Application Laid-Open (kokai) No. 2003-249604.

Patent Document 2: Japanese Patent Application Laid-Open (kokai) No. 2002-158312.

SUMMARY OF THE INVENTION

An object of the present invention is to solve the above-mentioned problems and to readily manufacture a dual-face package without need of the through-silicon via technology. The invention enables the manufacture of a leadframe-type dual-face package. In addition to application to mobile phones as conventionally practiced, the leadframe-type dual-face package can be effectively used as a package for various sensors (sound sensors, magnetic sensors, pressure sensors, etc.).

A dual-face package of the present invention has an LSI chip sealed with a mold resin, and electrodes for external connections on both of a front face and a back face. The LSI chip is bonded onto a die pad of a leadframe whose outer lead portions are exposed as back-face electrodes at at least the back face. The LSI chip and a plurality of inner lead portions of the leadframe are connected by wiring. At least some of the plurality of inner lead portions have front-face electrodes integrally formed by working a portion of the leadframe. Bump electrodes connected to respective head faces of the front-face electrodes serve as electrodes for external connections to another substrate or element. The bump electrodes are arrayed at respective positions different from those where the head faces of the front-face electrodes are exposed, by means of rerouting wiring traces on the mold resin.

In another dual-face package of the present invention, an LSI chip is bonded onto a die pad of a leadframe whose outer lead portions are exposed as back-face electrodes at at least the back face; the LSI chip and inner lead portions of the leadframe are connected by wiring; stud bumps are connected to the respective inner lead portions; bump electrodes connected to respective head faces of the stud bumps serve as front-face electrodes for connections to another substrate or element; and the bump electrodes are arrayed at respective positions different from those where the head faces of the stud bumps are exposed, by means of rerouting wiring traces on the mold resin.

A method for manufacturing a dual-face package of the present invention comprises unitarily forming a large number of leadframes each having outer lead portions exposed as back-face electrodes at at least the back face; integrally forming front-face electrodes on at least some of the plurality of inner lead portions of the leadframe by drawing a portion of the leadframe; bonding LSI chips onto respective die pads of the leadframes; connecting each of the LSI chips and the plurality of inner lead portions of corresponding one of the leadframes by wiring; carrying out batch sealing with a mold resin; and exposing head faces of the front-face electrodes, or bump electrodes connected to the respective head faces of the front-face electrodes at a surface of the mold resin so as to make the head faces or bump electrodes serve as electrodes for external connections to another substrate or element, followed by cutting for singulation.

Another method for manufacturing a dual-face package of the present invention comprises unitarily forming a large number of leadframes each having outer lead portions exposed as back-face electrodes at at least the back face; bonding LSI chips onto respective die pads of the leadframes; connecting each of the LSI chips and inner lead portions of corresponding one of the leadframes by wiring; connecting stud bumps to the respective inner lead portions; carrying out batch sealing with a mold resin, followed by cutting for singulation; and exposing bump electrodes connected to respective head faces of the stud bumps at a surface of the mold resin so as to make the bump electrodes serve as front-face electrodes for external connections to another substrate or element.

Since the present invention enables the manufacture of a dual-face package without need to form through-silicon vias, the present invention can provide a dual-face package which can not only be applied to mobile phones as practiced conventionally but also be effectively used as a package for various sensors (sound sensors, magnetic sensors, pressure sensors, etc.).

The present invention provides a dual-face package which can be applied to those fields which use those packages whose double-faced-electrode feature cannot be implemented in the wafer stage because of small chip size. The present invention can be effectively applied to packaging for, for example, DSP packages connected directly to microphones, and processor LSIs of small chip sizes for magnetic sensors and pressure sensors. The present invention allows use of an ordinary leadframe technology and thus can provide a dual-face package at low cost.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
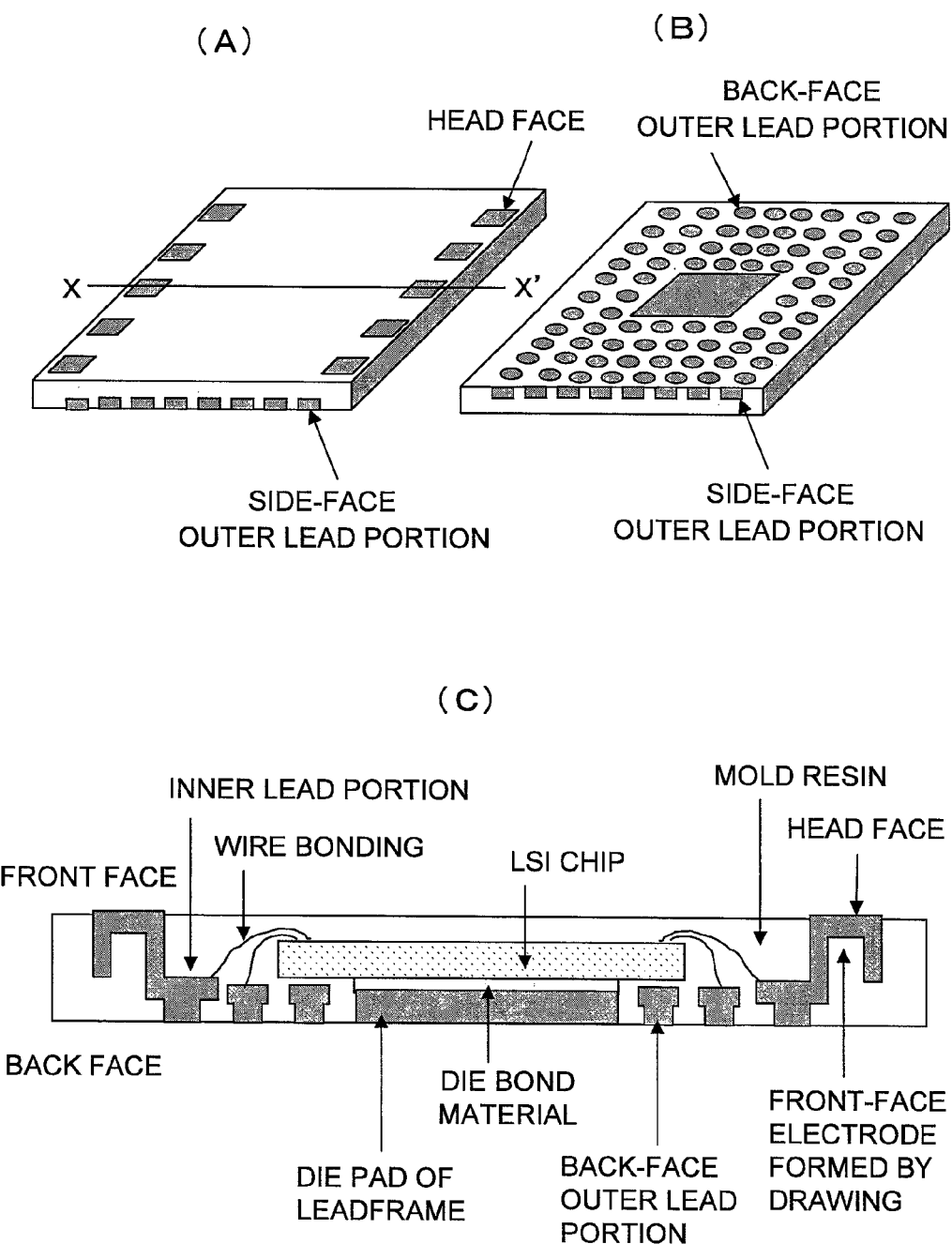
FIG. 1 is a series of views showing a first embodiment of a leadframe-type dual-face package according to the present invention, wherein (A) is a perspective front view, (B) is a perspective rear view, and (C) is a sectional view taken along line X-X' of view (A)

Embodiments of a dual-face package according to the present invention will next be described. Not only can the dual-face package of the present invention be used singly, but also the dual-face packages of the present invention can be stacked in such a manner that vertically adjacent dual-face packages are connected to each other, so as to be used as a single stacked semiconductor device. FIG. 1 shows a first embodiment of a leadframe-type dual-face package according to the present invention. In FIG. 1, (A) is a perspective front view; (B) is a perspective rear view; and (C) is a sectional view taken along line X-X' of view (A). The illustrated leadframe-type dual-face package has front-face electrodes which are formed by drawing such that head faces thereof are exposed on the front side. The head faces of the front-face electrodes function as terminals for external connections.

As shown in the sectional view of FIG. 1(C), an LSI chip is bonded onto a die pad of the leadframe by use of a die bond material, such as Ag paste (chip die bond). Although a single LSI chip is illustrated, a plurality of LSI chips can be stacked Inner lead portions of the leadframe and the LSI chip are connected by means of Au wires (wire bond). The ends of outer lead portions of the leadframe for electrically connecting the leadframe to a peripheral circuit are exposed at not only the back face of a mold (back-face outer lead portions) but also the side faces of the mold (side-face outer lead portions).

The front-face electrodes are formed by drawing a portion of the leadframe, in such a manner as to be integral with a portion of the inner lead portions and a portion of the outer lead portions (back-face or side-face outer lead portions). In the illustrated embodiment, a portion of the leadframe is worked so as to form three-dimensionally projecting portions, and the electrodes on both faces of the package are formed by utilization of the projecting portions. A large number of leadframes are unitarily formed by press working from, for example, a metal sheet of a Cu alloy plated with Pd (in a later step, a large number of leadframes formed unitarily undergo cutting for singulation). During the press working, portions corresponding to the front-face electrodes can be simultaneously formed by drawing. Alternatively, after the leadframes are formed by press working in an ordinary manner, a portion of each of the leadframes can be subjected to drawing.

Figure 2:
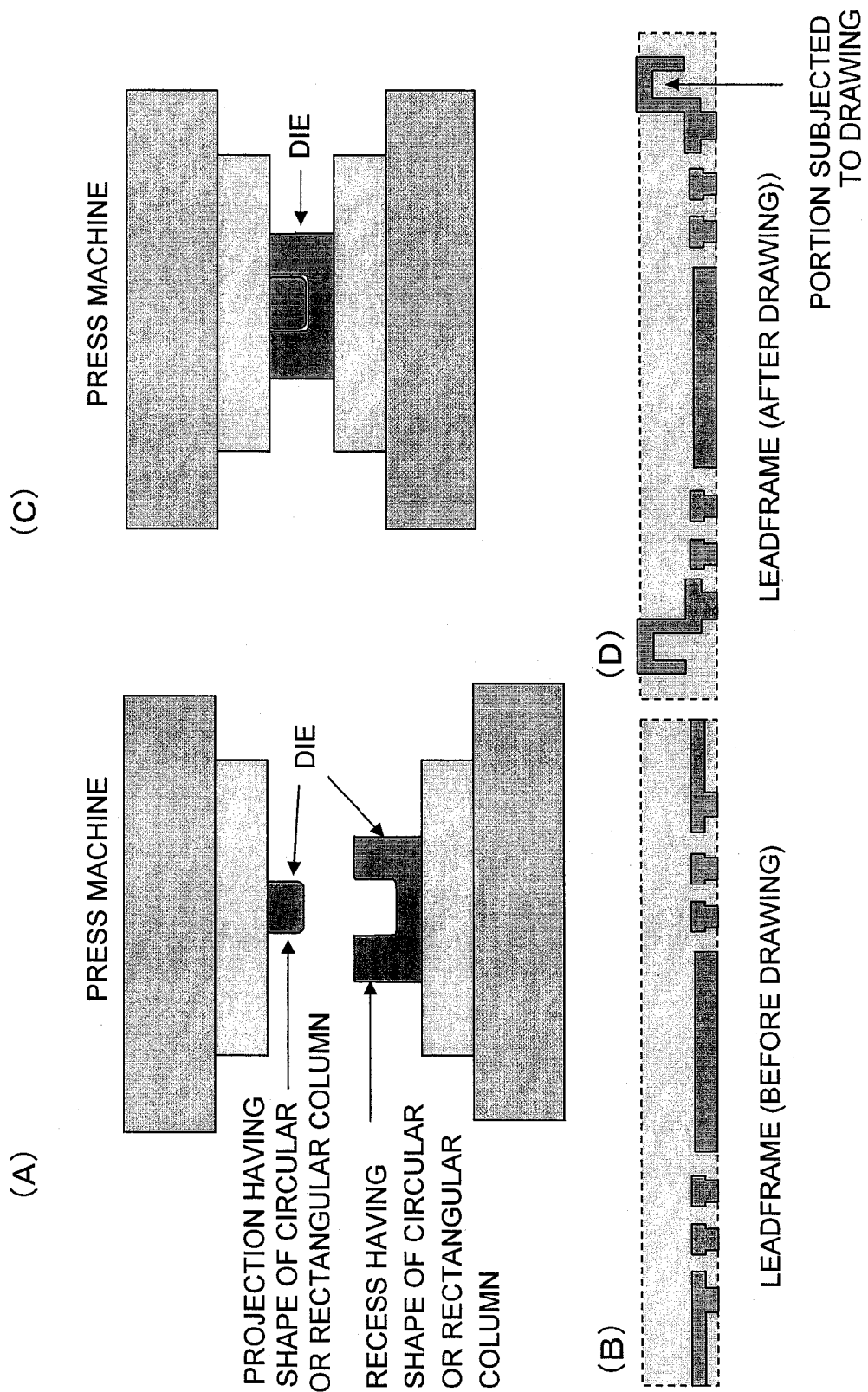
FIG. 2 is a series of views for explaining a process of drawing a portion of a leadframe, wherein (A) is a sectional view showing a state of a press machine in which a die is opened, (B) is a sectional view showing the leadframe before drawing, (C) is a sectional view showing a state of the press machine in which the die is closed, and (D) is a sectional view showing the leadframe after drawing.

FIG. 2 is a series of views for explaining a process of drawing a portion of the leadframe, wherein (A) is a sectional view showing a state of a press machine in which a die is opened, (B) is a sectional view showing the leadframe before drawing, (C) is a sectional view showing a state of the press machine in which the die is closed, and (D) is a sectional view showing the leadframe after drawing. As shown in FIG. 2(A), one die has a projection of a drawing shape of, for example, circular column or rectangular column. The other die has a recess whose shape coincides with the projection.

The leadframe before drawing shown in FIG. 2(B) is set in the press machine whose die is opened as shown in view (A), such that its portion to be subjected to drawing is placed in the opened die. Then, press working is carried out as shown in view (C). The leadframe after press working is shown in view (D). In views (B) and (D), the rectangle depicted by the dotted line imaginarily shows the outline of a final product. The leadframe before press working shown in view (B) can have a known configuration for use in, for example, a batch-sealed leadframe-type package (generally, a Quad Flat Non-lead (QFN) package).

Figure 3:
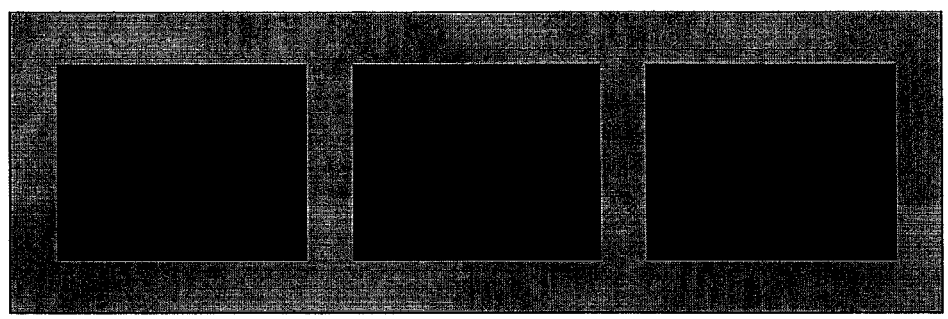
FIG. 3 is a view showing leadframes or organic substrates which are batch-molded into the form of islands.

As shown in FIG. 1(C), after wire bonding, the leadframe is sealed with epoxy resin in order to protect the leadframe from subjection to external stress and contamination. FIG. 3 shows the leadframes which are batch-molded into the form of islands (this also applies to organic multilayer or single-layer substrates, which will be described later). If the head faces of the front-face electrodes are not properly exposed at the front face of the mold, the upper surface of the mold is ground or polished so as to properly expose the head faces of the front-face electrodes.

The front-face electrodes may be used as electrodes for external connections. However, the electrodes for external connections can be relocated from a front-face electrode array to, for example, an area array by means of an ink jet process or screen printing. For this relocation, first, rerouting wiring traces to be connected to the respective head faces of the front-face electrodes are formed on the front face of the mold by means of an ink jet process (or screen printing) while using metal nanoparticles. Metal nanoparticles are of copper, silver, gold, or the like. By use of such metal nanoparticles, wiring traces are directly drawn by an ink jet process. More specifically, a required wiring pattern is drawn by an ink jet process employed in printers, while using an organic solvent which contains metal nanoparticles. In the case of screen printing, a nanopaste formed by mixing metal nanoparticles in an organic solvent is applied onto a substrate by screen printing; subsequently, firing through application of heat is carried out, thereby forming circuit wiring.

Figure 4:
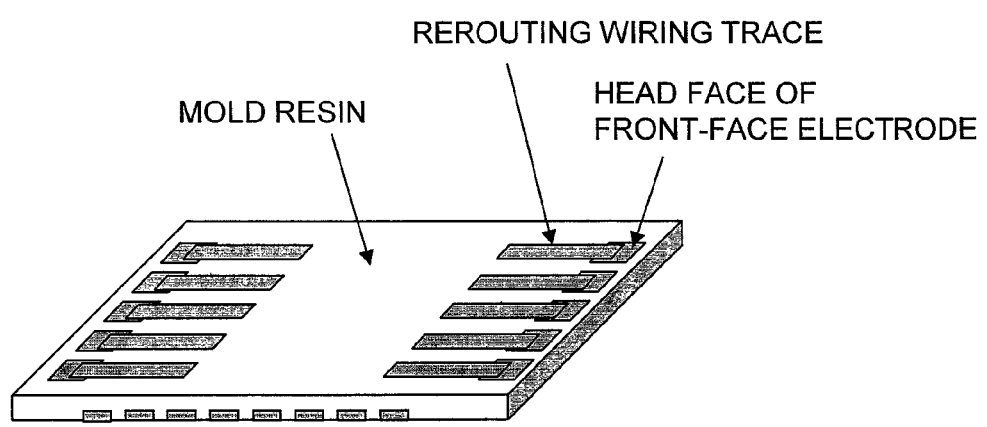
FIG. 4 is a perspective view showing rerouting wiring traces on the upper surface of a mold of a single chip.

FIG. 4 illustrates rerouting wiring traces on the upper surface of the mold of a single chip. After a protection film is formed on the rerouting wiring traces, openings are formed in the protection film at the respective positions where bumps are to be formed on the respective rerouting wiring traces. Bump electrodes for external connections can be formed in the respective openings. For formation of the bump electrodes, the protection film can be selectively formed by an ink jet process in such a manner as to avoid the positions where the bump electrodes are to be formed. By this procedure, the bump electrodes can be arrayed at respective positions different from those where the head faces of the front-face electrodes are exposed.

Next, cutting is carried out for chip singulation. A large number of leadframes formed unitarily from a metal sheet undergo cutting for singulation, thereby yielding individual products.

As described above, in the illustrated package, the formation of electrodes on both faces of the package can be implemented by means of intrapackage connections; i.e., by means of devising bonding wire, without need to use side-face wiring.

Figure 5:
FIG. 5 is a series of views showing a second embodiment of a leadframe-type dual-face package according to the present invention, wherein (A) is a perspective front view, (B) is a perspective rear view, (C) is a sectional view taken along line Y-Y' of view (A), and (D) is a view of a single stud bump.

FIG. 5 shows a second embodiment of a leadframe-type dual-face package according to the present invention. In FIG. 5, (A) is a perspective front view; (B) is a perspective rear view; (C) is a sectional view taken along line Y-Y' of view (A); and (D) is a view of a single stud bump. In the illustrated leadframe-type dual-face package, the head faces of stud bumps which are exposed on the front side function as terminals for external connections.

As shown in the sectional view of FIG. 5(C), an LSI chip is bonded onto a die pad of the leadframe by use of a die bond material, such as Ag paste (chip die bond). Although a single LSI chip is illustrated, a plurality of LSI chips can be stacked Inner lead portions of the leadframe and the LSI chip are connected by means of Au wires (wire bond). The ends of outer lead portions of the leadframe for electrically connecting the leadframe to a peripheral circuit are exposed at not only the back face of the mold (back-face outer lead portions) but also the side faces of the mold (side-face outer lead portions).

Stud bumps are connected to the respective inner lead portions of the leadframe (a portion of or all of a plurality of inner leads). The stud bumps can be formed by use of a well known technique. According to a conventionally known technique, projecting bumps (stud bumps) are formed on respective electrodes of a semiconductor chip, and the bumps are joined directly to respective electrodes formed on a board on which the semiconductor chip is mounted. The stud bumps used in the present invention can be formed by use of such a well known technique.

As illustrated, a plurality of stud bumps are connected to the respective inner lead portions of the leadframe at wire bond positions or positions two-dimensionally shifted from the wire bond positions. Connections to another substrate or element are established via the stud bumps. The stud bumps can be connected to the respective inner lead portions of the leadframe as follows: the stud bumps, each being preformed as shown in FIG. 5(D), are bonded to the respective inner lead portions at required positions by use of a technique similar to a wire bonding technique. Alternatively, a well known technique is used as follows: an end of a wire of gold or the like is melted through application of heat so as to be formed into a ball shape; subsequently, the ball is thermocompression-bonded, in the presence of ultrasonic waves, to the corresponding inner lead portion at a required position, followed by cutting off of the wire.

After the stud bumps are connected, the stud bumps are leveled to the height of the upper face of the package. Alternatively, after the next batch-molding step for sealing, the upper surface of the mold is ground or polished, whereby the upper faces of the stud bumps can also be leveled.

After wires are bonded, and the stud bumps are connected and leveled, the leadframe is sealed with epoxy resin in order to protect the leadframe from subjection to external stress and contamination. The subsequent processing can be similar to that of the first embodiment, which has been described with reference to FIG. 1. If necessary, the upper surface of the mold is ground or polished so as to properly expose the head faces of the stud bumps. An external connection array can be relocated from a stud bump array to an area array by means of an ink jet process or screen printing. For this relocation, rerouting wiring traces are formed, and a protection film is formed on the rerouting wiring traces. Then, bump electrodes for external connections can be formed on the respective rerouting wiring traces. By this procedure, the bump electrodes can be arrayed at respective positions different from those where the head faces of the stud bumps are exposed. Next, cutting is carried out for chip singulation, thereby yielding individual products.

As described above, in the illustrated package, the formation of electrodes on both faces of the package can be implemented by means of intrapackage connections; i.e., by means of devising bonding wire, without need to use side-face wiring.

While specific embodiments of the invention have been shown and described in detail to illustrate the application of the principles of the invention, it will be understood that the invention may be embodied otherwise without departing from such principles.

What is claimed is:

1. A method for manufacturing a dual-face package which has an LSI chip sealed with a mold resin, and electrodes for external connections on both of a front face and a back face, the method comprising:
   unitarily forming a number of leadframes each having outer lead portions exposed as back-face electrodes at at least the back face;
   integrally forming front-face electrodes on at least some of the plurality of inner lead portions of the leadframe by drawing a portion of the leadframe;
   bonding LSI chips onto respective die pads of the leadframes, and connecting each of the LSI chips and the plurality of inner lead portions of corresponding one of the leadframes by wiring;
   carrying out batch sealing with a mold resin; and
   exposing head faces of the front-face electrodes, or bump electrodes connected to the respective head faces of the front-face electrodes at a surface of the mold resin so as to make the head faces or bump electrodes serve as electrodes for external connections to another substrate or element, followed by cutting for singulation.

2. A method in accordance with claim 1, wherein at least a portion of one or more of said leadframes extends continuously and uninterrupted from said back face to said front face.

3. A method in accordance with claim 1, wherein one or more of said inner lead portions are located at a position below one or more of said LSI chips.

4. A method for manufacturing a dual-face package which has an LSI chip sealed with a mold resin, and electrodes for external connections on both of a front face and a back face, the method comprising:
   unitarily forming a number of leadframes each having outer lead portions exposed as back-face electrodes at at least the back face;
   bonding LSI chips onto respective die pads of the leadframes, and connecting each of the LSI chips and inner lead portions of corresponding one of the leadframes by wiring;
   connecting stud bumps to the respective inner lead portions;

carrying out batch sealing with a mold resin, followed by cutting for singulation; and exposing bump electrodes connected to respective head faces of the stud bumps at a surface of the mold resin so as to make the bump electrodes serve as front-face electrodes for external connections to another substrate or element.

5. A method in accordance with claim 4, wherein one or more of said inner lead portions are located at a position below one or more of said LSI chips.

6. A method for manufacturing a dual-face package, the method comprising:

forming one or more leadframes, said one or more leadframes having at least one outer lead portion and at least one inner lead portion;

bonding at least one LSI chip onto a die pad of said one or more leadframes;

connecting said at least one LSI chip to at least said at least one inner lead portion;

applying mold resin to at least said leadframe to form an electrode package after said at least one LSI chip is connected to said at least one inner lead portion, said at least one outer lead portion being exposed on a back face of said electrode package; and forming at least one front-face electrode by one of a portion of said one or more leadframes and exposing a surface of at least one stud bump connected to said at least one inner lead portion at a surface of the mold resin, wherein one of at least a portion of said one or more leadframes and at least a portion of said surface of said at least one stud bump forms an electric connection to another substrate or element outside of said mold resin.

7. A method in accordance with claim 6, wherein one or more of said inner lead portions are located at a position below one or more of said LSI chips.

8. A method in accordance with claim 6, wherein said at least said portion of said one or more of said leadframes extends continuously and uninterrupted from said back face to said front face.

* * * * *